(12) United States Patent
Rathburn

(10) Patent No.: US 8,232,632 B2
(45) Date of Patent: Jul. 31, 2012

(54) COMPOSITE CONTACT FOR FINE PITCH ELECTRICAL INTERCONNECT ASSEMBLY

(75) Inventor: James J. Rathburn, Greenfield, MN (US)

(73) Assignee: R&D Sockets, Inc., South Plainfield, NJ (US)

(*) Notice: Subject to any disclaimer, the term of this patent is extended or adjusted under 35 U.S.C. 154(b) by 0 days.

(21) Appl. No.: 13/277,893

(22) Filed: Oct. 20, 2011

(65) Prior Publication Data
US 2012/0088378 A1    Apr. 12, 2012

Related U.S. Application Data

(63) Continuation of application No. 12/293,499, filed as application No. PCT/US2007/064298 on Mar. 19, 2007, now Pat. No. 8,044,502.

(60) Provisional application No. 60/784,030, filed on Mar. 20, 2006.

(51) Int. Cl.
*H01L 23/52* (2006.01)

(52) U.S. Cl. ........ 257/692; 257/698; 257/727; 257/729; 257/730; 257/731; 257/E23.023; 257/E23.151; 438/121; 438/612; 438/614; 438/615

(58) Field of Classification Search .................. None
See application file for complete search history.

(56) References Cited

U.S. PATENT DOCUMENTS

| | | |
|---|---|---|
| 2,231,347 A | 2/1941 | Reutter |
| 2,980,881 A | 4/1961 | McKee |
| 3,320,658 A | 5/1967 | Bolda et al. |
| 3,500,295 A | 3/1970 | Faber et al. |
| 3,719,981 A | 3/1973 | Steltz |
| 3,838,382 A | 9/1974 | Sugar |
| 3,864,004 A | 2/1975 | Friend |
| 3,865,462 A | 2/1975 | Cobaugh et al. |
| 3,889,364 A | 6/1975 | Krueger |
| 4,054,354 A | 10/1977 | Unger |
| 4,056,302 A | 11/1977 | Braun et al. |
| 4,097,266 A | 6/1978 | Takahashi et al. |
| 4,140,361 A | 2/1979 | Sochor |

(Continued)

FOREIGN PATENT DOCUMENTS

EP    0 362 841    11/1990

(Continued)

OTHER PUBLICATIONS

International Search Report and Written Opinion of international application No. PCT/US2007/064298, mailed Sep. 10, 2007, 11 pp.

*Primary Examiner* — David E Graybill
(74) *Attorney, Agent, or Firm* — Duane Morris LLP

(57) ABSTRACT

An electrical interconnect assembly for electrically interconnecting terminals on a first circuit member with terminals on a second circuit member. The electrical interconnect assembly includes a housing having a plurality of through openings extending between a first surface and a second surface. A plurality of composite contacts are positioned in a plurality of the through openings. The composite contacts include a conductive member having a central portion and at least first and second interface portions. One or more polymeric layers extend along at least the central portion conductive member. One or more coupling features on the composite contacts engage with the housing. At least one engagement feature formed in the polymeric layers proximate the first interface portion mechanically couples with the terminals on the first circuit member.

21 Claims, 13 Drawing Sheets

U.S. PATENT DOCUMENTS

| | | |
|---|---|---|
| 4,274,700 A | 6/1981 | Keglewitsch et al. |
| 4,380,518 A | 4/1983 | Wydro |
| 4,391,482 A | 7/1983 | Czeschka |
| 4,395,086 A | 7/1983 | Marsh |
| 4,396,140 A | 8/1983 | Jaffe et al. |
| 4,462,534 A | 7/1984 | Bitaillou et al. |
| 4,482,937 A | 11/1984 | Berg |
| 4,602,830 A | 7/1986 | Lockard |
| 4,641,426 A | 2/1987 | Hartman et al. |
| 4,655,517 A | 4/1987 | Bryce |
| 4,664,309 A | 5/1987 | Allen et al. |
| 4,678,250 A | 7/1987 | Romine et al. |
| 4,705,205 A | 11/1987 | Allen et al. |
| 4,722,470 A | 2/1988 | Johary |
| 4,767,344 A | 8/1988 | Noschese |
| 4,802,862 A | 2/1989 | Seidler |
| 4,830,264 A | 5/1989 | Bitaillou et al. |
| 4,871,110 A | 10/1989 | Fukasawa et al. |
| 4,884,335 A | 12/1989 | McCoy et al. |
| 4,904,212 A | 2/1990 | Durbin et al. |
| 4,915,286 A | 4/1990 | Mentzer et al. |
| 4,943,846 A * | 7/1990 | Shirling ................. 257/697 |
| 4,961,709 A | 10/1990 | Noschese |
| 5,024,372 A | 6/1991 | Altman et al. |
| 5,044,992 A | 9/1991 | Dzwonczyk et al. |
| 5,060,844 A | 10/1991 | Behun et al. |
| 5,093,986 A | 3/1992 | Mandal et al. |
| 5,098,311 A | 3/1992 | Roath et al. |
| 5,111,991 A | 5/1992 | Clawson et al. |
| 5,118,027 A | 6/1992 | Braun et al. |
| 5,120,237 A | 6/1992 | Fussell |
| 5,131,871 A | 7/1992 | Banakis et al. |
| 5,145,104 A | 9/1992 | Apap et al. |
| 5,167,512 A | 12/1992 | Walkup |
| 5,199,885 A | 4/1993 | Korsunsky et al. |
| 5,203,075 A | 4/1993 | Angulas et al. |
| 5,207,372 A | 5/1993 | Funari et al. |
| 5,222,649 A | 6/1993 | Funari et al. |
| 5,229,016 A | 7/1993 | Hayes et al. |
| 5,255,839 A | 10/1993 | Alves et al. |
| 5,261,155 A | 11/1993 | Angulas et al. |
| 5,269,453 A | 12/1993 | Melton et al. |
| 5,275,330 A | 1/1994 | Isaacs et al. |
| 5,284,287 A | 2/1994 | Wilson et al. |
| 5,324,569 A | 6/1994 | Nagesh et al. |
| 5,342,211 A | 8/1994 | Broeksteeg |
| 5,346,118 A | 9/1994 | Degani et al. |
| 5,350,292 A | 9/1994 | Sanders et al. |
| 5,354,218 A | 10/1994 | Fry et al. |
| 5,355,283 A | 10/1994 | Marrs et al. |
| 5,358,417 A | 10/1994 | Schmedding |
| 5,377,902 A | 1/1995 | Hayes |
| 5,387,139 A | 2/1995 | McKee et al. |
| 5,395,250 A | 3/1995 | Englert, Jr. et al. |
| 5,409,157 A | 4/1995 | Nagesh et al. |
| 5,410,260 A | 4/1995 | Kazama |
| 5,410,807 A | 5/1995 | Brose et al. |
| 5,427,535 A | 6/1995 | Sinclair |
| 5,431,332 A | 7/1995 | Kirby et al. |
| 5,435,482 A | 7/1995 | Variot et al. |
| 5,442,852 A | 8/1995 | Danner |
| 5,445,313 A | 8/1995 | Boyd et al. |
| 5,453,017 A | 9/1995 | Belopolsky |
| 5,462,456 A | 10/1995 | Howell |
| 5,467,913 A | 11/1995 | Namekawa et al. |
| 5,477,933 A | 12/1995 | Nguyen |
| 5,489,750 A | 2/1996 | Sakemi et al. |
| 5,491,303 A | 2/1996 | Weiss |
| 5,492,266 A | 2/1996 | Hoebener et al. |
| 5,495,668 A | 3/1996 | Furusawa et al. |
| 5,498,167 A | 3/1996 | Seto et al. |
| 5,499,487 A | 3/1996 | McGill |
| 5,504,277 A | 4/1996 | Danner |
| 5,516,030 A | 5/1996 | Denton |
| 5,516,032 A | 5/1996 | Sakemi et al. |
| 5,518,410 A | 5/1996 | Masami |
| 5,519,580 A | 5/1996 | Natarajan et al. |
| 5,534,127 A | 7/1996 | Sakai |
| 5,539,153 A | 7/1996 | Schwiebert et al. |
| 5,542,174 A | 8/1996 | Chiu |
| 5,545,051 A | 8/1996 | Summers et al. |
| 5,580,283 A | 12/1996 | O'Sullivan et al. |
| 5,591,049 A | 1/1997 | Dohnishi |
| 5,591,941 A | 1/1997 | Acocella et al. |
| 5,593,322 A | 1/1997 | Swamy et al. |
| 5,613,882 A | 3/1997 | Hnatuck et al. |
| 5,618,207 A | 4/1997 | Maejima |
| 5,643,009 A | 7/1997 | Dinkel et al. |
| 5,702,255 A | 12/1997 | Murphy et al. |
| 5,718,607 A | 2/1998 | Murphy et al. |
| 5,730,606 A | 3/1998 | Sinclair |
| 5,746,608 A | 5/1998 | Taylor |
| 5,772,451 A | 6/1998 | Dozier, III et al. |
| 5,829,988 A | 11/1998 | McMillan et al. |
| 5,830,012 A | 11/1998 | Ortega et al. |
| 5,873,742 A | 2/1999 | McHugh |
| 5,913,687 A | 6/1999 | Rathburn |
| 5,947,749 A | 9/1999 | Rathburn |
| 5,969,952 A | 10/1999 | Hayashi et al. |
| 6,042,389 A | 3/2000 | Lemke et al. |
| 6,042,423 A | 3/2000 | Murr et al. |
| 6,095,842 A | 8/2000 | Lin |
| 6,116,923 A | 9/2000 | Szu |
| 6,146,199 A | 11/2000 | Ortega et al. |
| 6,178,629 B1 | 1/2001 | Rathburn |
| 6,247,938 B1 | 6/2001 | Rathburn |
| 6,315,576 B1 | 11/2001 | Neidich |
| 6,325,644 B1 | 12/2001 | Lemke et al. |
| 6,345,987 B1 | 2/2002 | Mori et al. |
| 6,394,819 B1 | 5/2002 | Mosser, III et al. |
| 6,409,521 B1 | 6/2002 | Rathburn |
| 6,533,590 B1 | 3/2003 | Lee et al. |
| 6,574,114 B1 * | 6/2003 | Brindle et al. ............... 361/769 |
| 6,623,284 B1 | 9/2003 | Korsunsky |
| 6,830,460 B1 | 12/2004 | Rathburn |
| 7,021,942 B2 | 4/2006 | Grant et al. |
| 7,040,902 B2 | 5/2006 | Li |
| 7,297,003 B2 * | 11/2007 | Rathburn et al. ............. 439/66 |
| 2003/0003779 A1 | 1/2003 | Rathburn |
| 2003/0013330 A1 | 1/2003 | Takeuchi |
| 2003/0114029 A1 | 6/2003 | Lee et al. |
| 2004/0253852 A1 | 12/2004 | Regnier et al. |
| 2005/0099763 A1 * | 5/2005 | Rathburn ..................... 361/600 |
| 2007/0145564 A1 * | 6/2007 | Honer ......................... 257/690 |
| 2009/0127698 A1 | 5/2009 | Rathburn |

FOREIGN PATENT DOCUMENTS

| | | |
|---|---|---|
| EP | 0 847 112 | 3/2001 |
| EP | 0 817 319 | 9/2002 |
| EP | 0 836 243 | 1/2007 |
| WO | WO 98/15989 | 4/1998 |
| WO | WO 2004066642 | 8/2004 |
| WO | WO 2004068640 | 8/2004 |
| WO | WO 2004068641 | 8/2004 |

* cited by examiner

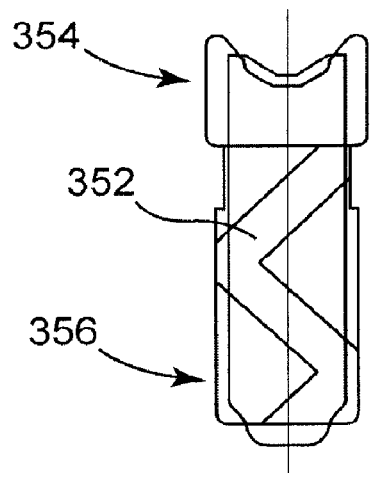
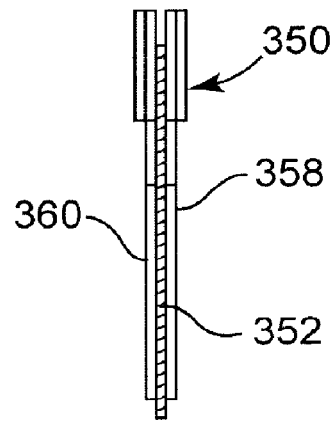
Fig. 7A    Fig. 7B
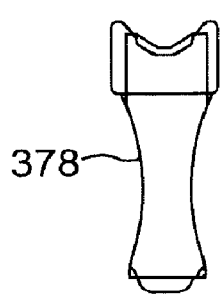
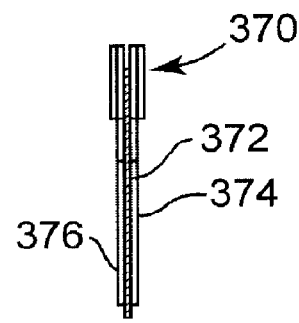
Fig. 8A    Fig. 8B
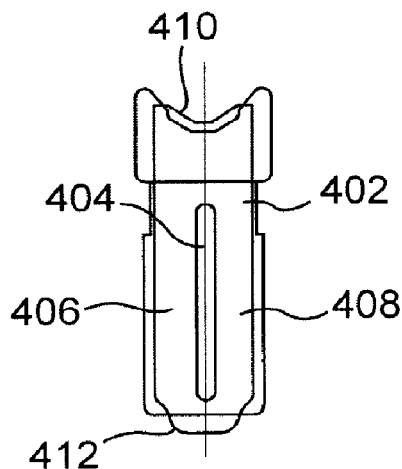
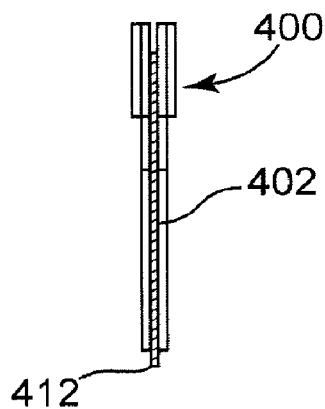
Fig. 9A    Fig. 9B

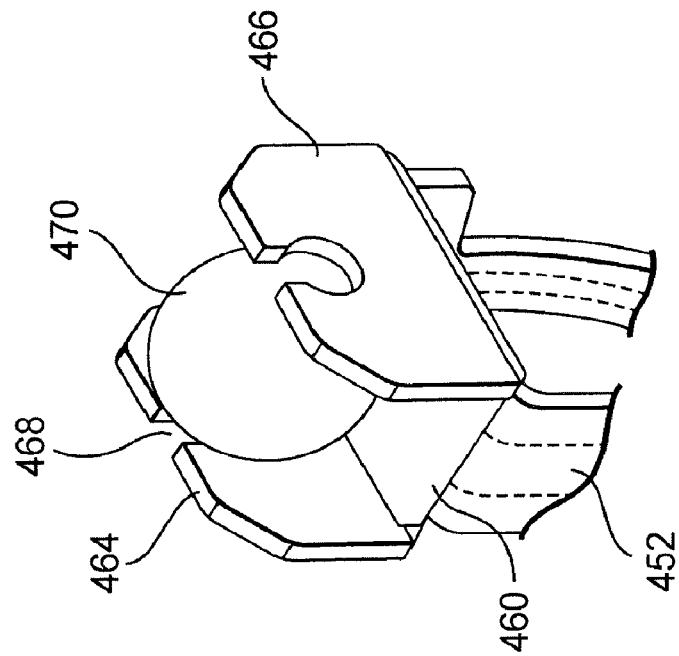
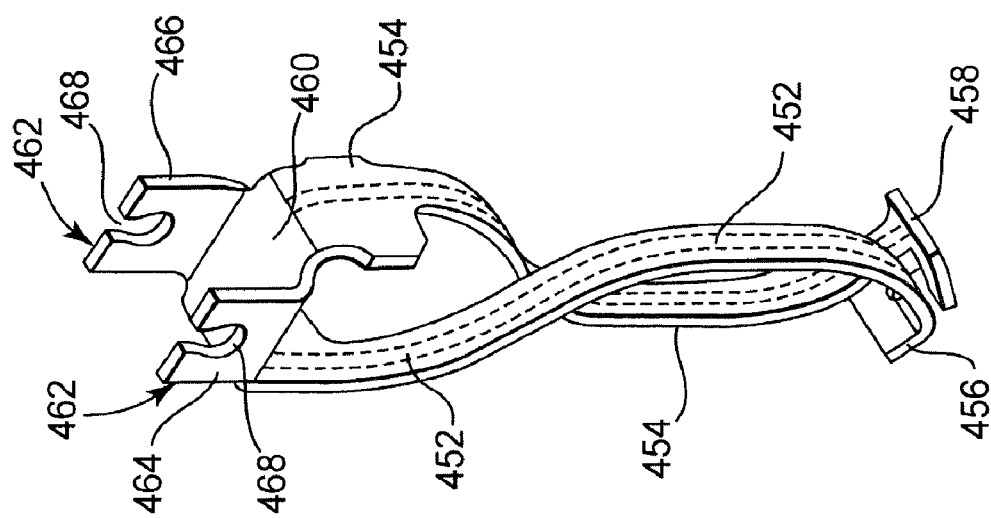

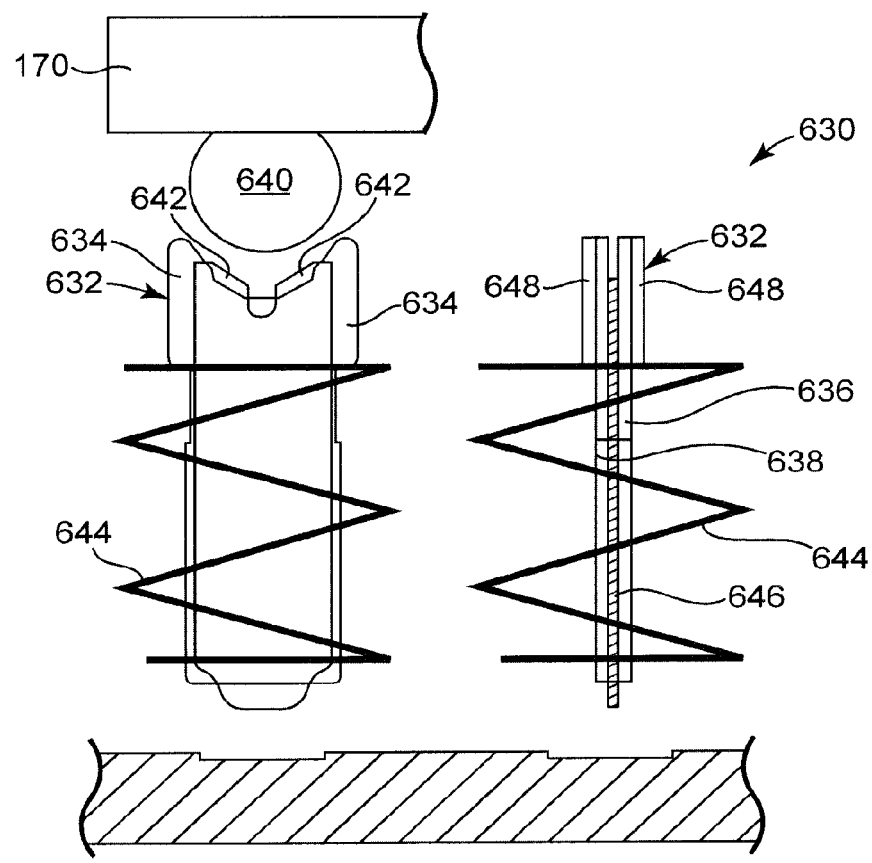
Fig. 14
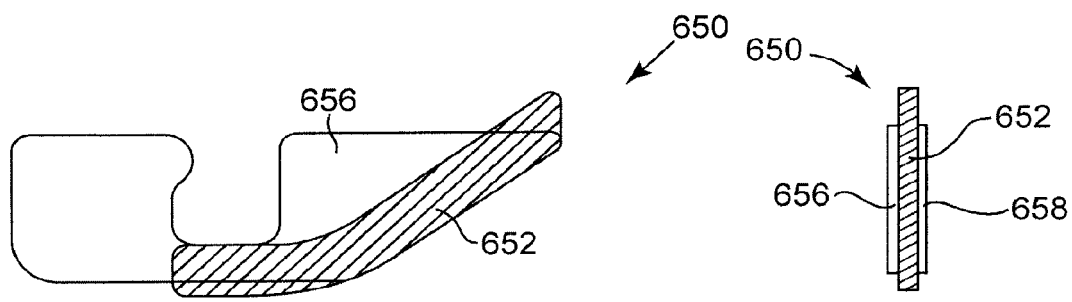
Fig. 15A  Fig. 15B

COMPOSITE CONTACT FOR FINE PITCH ELECTRICAL INTERCONNECT ASSEMBLY

CROSS REFERENCE TO RELATED APPLICATIONS

This is a continuation of application Ser. No. 12/293,499, filed Dec. 8, 2008 (§371), U.S. Pat. No. 8,044,502, granted Oct. 25, 2011, which is the US national phase of international application PCT/US 2007/064298, filed Mar. 19, 2007, claiming the priority of U.S. provisional application 60/784,030, filed Mar. 20, 2006.

FIELD OF THE INVENTION

The present invention is directed to a composite contact for an electrical interconnect assembly that electrically connects a first circuit members to one or more second circuit members, and in particular, to a composite contact that primarily relies on one or more polymeric layers for the mechanical properties of the composite contact.

BACKGROUND OF THE INVENTION

The current trend in connector design for those connectors utilized in the computer field is to provide both high density and high reliability connectors between various circuit devices. High reliability for such connections is essential due to potential system failure caused by improper connections of devices. Further, to assure effective repair, upgrade, testing and/or replacement of various components, such as connectors, cards, chips, boards, and modules, it is highly desirable that such connections be separable and reconnectable in the final product.

Pin-type connectors soldered into plated through holes or vias are among the most commonly used in the industry today. Pins on the connector body are inserted through plated holes or vias on a printed circuit board and soldered in place using a conventional mechanism. Another connector or a packaged semiconductor device is then inserted and retained by the connector body by mechanical interference or friction. The tin lead alloy solder and associated chemicals used throughout the process of soldering these connectors to the printed circuit board have come under increased scrutiny due to their environmental impact. The plastic housings of these connectors undergo a significant amount of thermal activity during the soldering process, which stresses the component and threatens reliability.

The soldered contacts on the connector body are typically the mechanical support for the device being interfaced by the connector and are subject to fatigue, stress deformation, solder bridging, and co-planarity errors, potentially causing premature failure or loss of continuity. In particular, as the mating connector or semiconductor device is inserted and removed from the connector attached to the printed circuit board, the elastic limit on the contacts soldered to the circuit board may be exceeded causing a loss of continuity. These connectors are typically not reliable for more than a few insertions and removals of devices. These devices also have a relatively long electrical length that can degrade system performance, especially for high frequency or low power components. The pitch or separation between adjacent device leads that can be produced using these connectors is also limited due to the risk of shorting.

Another electrical interconnection method is known as wire bonding, which involves the mechanical or thermal compression of a soft metal wire, such as gold, from one circuit to another. Such bonding, however, does not lend itself readily to high-density connections because of possible wire breakage and accompanying mechanical difficulties in wire handling.

An alternate electrical interconnection technique involves placement of solder balls or the like between respective circuit elements. The solder is reflowed to form the electrical interconnection. While this technique has proven successful in providing high-density interconnections for various structures, this technique does not allow facile separation and subsequent reconnection of the circuit members.

An elastomer having a plurality of conductive paths has also been used as an interconnection device. The conductive elements embedded in the elastomeric sheet provide an electrical connection between two opposing terminals brought into contact with the elastomeric sheet. The elastomeric material that supports the conductive elements compresses during usage to allow some movement of the conductive elements. Such elastomeric connectors require a relatively high force per contact to achieve adequate electrical connection, exacerbating non-planarity between mating surfaces. Location of the conductive elements is generally not controllable. Elastomeric connectors may also exhibit a relatively high electrical resistance through the interconnection between the associated circuit elements. The interconnection with the circuit elements can be sensitive to dust, debris, oxidation, temperature fluctuations, vibration, and other environmental elements that may adversely affect the connection.

In general, to provide a superior electrical performance path, the metal conductor should be short, and preferably wide to provide a low inductance environment. This becomes very difficult in some traditional contact structures using stamped metal since very small and wide contacts do not have much compliance as springs. As contacts get smaller and the spacing between them is reduced, the features on the contacts make them very intricate and difficult to manufacture.

Most electrical contacts are made by stamping and forming metal into precise shapes, then assembling them into a plastic insulator housing. These contact members are typically inserted into a plastic or insulating housing, which positions them and prevents them from touching an exposed metal portion against that of a neighboring contact. Design features are incorporated to provide retention within the housing, or maximize the flexural properties of the springs. These features must be incorporated into the traditional contact members themselves, often creating changes in the cross section of the electrical path, or extra metal in places that may add parasitic or stub effect that tend to degrade signal quality.

Traditional flexible circuit, on the other hand, use a thin layer of copper mated with a layer of polyimide or liquid crystal polymer. The very nature of the circuit is such that it can bend and flex without breaking the electrical circuit. These circuits are typically quite readily designed with close tolerance and specific geometries that typically do not degrade the electrical signal significantly. The conductive traces on flexible circuits, however, are too flexible for use in conventional connector assemblies. The conductive traces are too flexible to provide sufficient normal force to remain electrically connected to the circuit members. If a conductive trace on a flexible circuit was used in a traditional connector or socket, the contact would flex out of the way and not spring back as with normal contacts, resulting in an open circuit.

BRIEF SUMMARY OF THE INVENTION

Various embodiments of the present application are directed to a composite contact for an electrical interconnect assembly that electrically connects a first circuit members to one or more second circuit members. The present invention is also directed to the composite contacts.

The composite contacts include a flexible conductive member with at least one laminated polymeric layer. The polymeric layer preferably surrounds or encapsulates the flexible conductive member except for exposed portions that provide electrical connection points to at least two external circuit members, such as a printed circuit or IC device. Alternatively, side edges of the conductive member may be exposed when sandwiched between the polymeric layers.

The polymeric layers act as insulators and provide most of the mechanical properties for the composite contact to operate in a traditional socket or connector application. Preferably, only the desired areas of the conductive member are exposed for electrical contact. This feature eliminates or greatly reduces the need for the traditional insulating properties of the housing used to keep the contacts from shorting.

The polymeric layers can also consist of materials with improved dielectric constant over that of the traditional plastic used for such housings. The resulting composite contact consequently provides increased electrical performance along the conductive path. The reduced need for insulating walls in the housing also permits the complexity and size of the housing to be reduced. As a result, the present composite contacts can be arranged at finer pitches than conventional connectors. In some embodiments, the composite contacts can even touch each other without effecting electrical performance.

The inherently different physical properties of the polymeric layers supports the otherwise weak conductive member in specific areas or with specific material properties to provide the mechanical properties of more traditional contacts or springs. The polymeric layers also prevent solder from wicking along the length of the conductive member during the reflow process.

In another embodiment, the polymeric layer can be structured as the main alignment and interface portion, while the exposed metal tip simply contacts the conductive surface of the circuit member. In one embodiment, the polymeric layer forms a mechanical interface or mechanical interlock with the circuit member and/or the housing.

Traditional contact members tend to accumulate solder on the metal tip, which may cause a rise in contact resistance and eventual poor contact. In one embodiment, the polymeric layers provide engagement features that are configured to form a mechanical interlock, such as for example a snap-fit relationship, with the balls of a ball grid array. The plastic portion provides the majority of the interface to the circuit member. The engagement features can be a hole, a recess, a protrusion, a barb mechanically, or a variety of other structures that mechanically coupled or engage to the solder member. The tabs and/or the engagement features can plastically and/or elastically deform into engagement with the solder member. The solder member can be spherical, cubic, hexagonal, or a variety of other shapes. In other embodiments, engagement serves to position to components relative to each other at an interface.

In some embodiments, the exposed metal tips of the conductive member are plated with special materials to reduce the effects of solder contamination, such as for example Rhodium. In another embodiment, the exposed metal tip of the conductive member can be shaped to provide a focused pressure point to repeatedly pierce solder. The nature of the plastic portion of the present composite contact provides a natural mask which can be used to concentrate plating using every day processes. In another embodiment, different portions of the base metal of the conductive member can be treated differently by exposing different portions at different times during the process, similar to how printed circuit boards are made.

Composite contacts of some embodiments combine the mechanical properties of at least two or more different materials to create a composite contact with desired spring force. For example, a very thin conductive member and a very thin polymeric layer are both very flexible and do typically not make good springs. Combining the layers, however, provides a composite spring that reacts differently. The layers support each other, and can be designed such that the combination provides a desired spring force. The present composite contact can optionally include various layers, geometries or materials that direct bending to a particular area or direction with localized areas of weakness or stiffness. Since plastic bends much differently than metal, the laminate can bend and spring back much differently than the conductive member could do alone.

A polymeric layer of specific shape can be added at a strategic location to induce or inhibit flexing in a particular direction. A spring layer of plastic can be shaped such that it provides a desired flexural property and force. In addition, the composite contact can be sheared to allow for split flexing, with a spring member located on opposite sides of the contact, such that the split composite contacts flex in opposite directions. Due to the nature of the flexible contact structure, multiple conductive beams can be folded to create multiple signal paths or terminal engagement beams.

The present composite contact permits the path of the conductive member to be made short, straight, and wide as the pitch between adjacent contacts will allow maximizing signal integrity, while the polymeric portions can contain the mechanical retention or spring features.

The present composite contacts preferably form one of a press-fit, an interlocking, or a snap-fit relationship with one of the circuit members and/or the housing. In one embodiment, the housing includes a plurality of layers forming a plurality of substantially non-moldable through openings that extend between a first surface and a second surface. Engagement or interlocking feature used for pressing or snapping the composite contact into the housing are preferably incorporated into the plastic portion. At least one composite contact forms an interlocking relationship with one of the substantially non-moldable through opening. The through openings are preferably arranged in a two-dimensional array for engagement with various circuit members.

In one embodiment, at least one layer or a portion of the housing is an elastomeric materials that supports the composite contacts. The elastomeric housing can be molded around the composite contacts or formed with through openings into which the composite contacts are inserted.

A sealing layer optionally substantially seals the through openings between the composite contacts and the housing along at least one of the first surface and the second surface. The sealing layer preferably comprises a curable polymeric material. In one embodiment, a polymeric layer is overmolded to secure the composite contacts to the housing.

In one embodiment, the conductive member includes first and second beams that comprise a serpentine shape forming two loops. The first beam is preferably attached to the base portion at a discrete location from the second beam. In one embodiment, the first and second beams overlap at a location between the respective proximal ends and distal ends to form a first loop. The distal ends of the first and second beams comprise a second loop. In one embodiment, the distal ends of the first and second beams form a loop when engaged with one of the first or second circuit members.

BRIEF DESCRIPTION OF THE SEVERAL VIEW OF THE DRAWINGS

FIGS. 7A and 7B are front and side sectional views of alternate composite contact in accordance with an embodiment of the present invention.

FIGS. 8A and 8B are front and side sectional views of alternate composite contact in accordance with an embodiment of the present invention.

FIGS. 9A and 9B are front and side sectional views of alternate composite contact in accordance with an embodiment of the present invention.

FIGS. 10A and 10B are perspective views of alternate composite contact in accordance with an embodiment of the present invention.

FIG. 14 is a side sectional view of the alternate electrical interconnect assembly with composite contacts in accordance with an embodiment of the present invention.

FIG. 15A is a front sectional view of alternate composite contact in accordance with an embodiment of the present invention.

FIG. 15B is a side view of the composite contact of FIG. 15A.

DETAILED DESCRIPTION OF THE INVENTION

Figure 1:
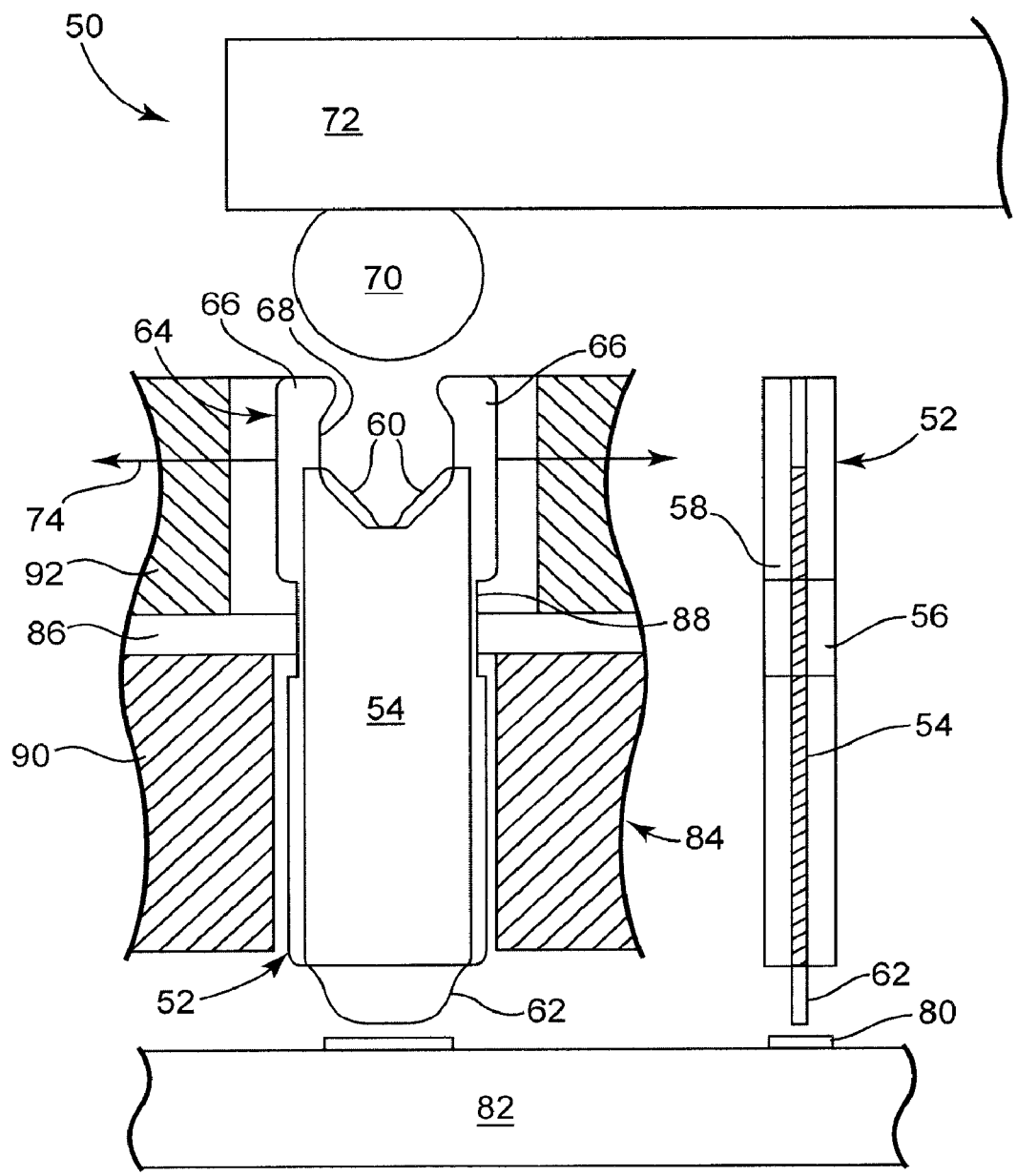
FIG. 1 is a side sectional view of an electrical interconnect assembly with composite contacts in accordance with an embodiment of the present invention.

FIG. 1 is a side sectional view of an interconnect assembly 50 with composite contacts 52 in accordance with an embodiment of the present invention. The composite contacts 52 are illustrated in side and front section views. The composite contact 52 on the right-hand side of FIG. 1 illustrates conductive member 54 attached to first and second polymeric layers 56, 58. Composite contact 52 on the left-hand side of FIG. 1 is illustrated with polymeric layer 58 removed.

As use herein, the term "polymeric layer" refers to one or more layers of a moldable dielectric or an insulating material, such as for example, a polyethylene, lightweight polyester composites, polyvinylchloride, Kapton® polyimide film, or polytetrafluoroethelyne (PTFE). The conductive member can be any conductive material, such as for example gold, copper, or BeCu.

In one embodiment, the conductive member 54 is sandwiched between the polymeric layers 56, 58, potentially leaving at least a portion of the side edges of the conductive member 54 exposed. For example, the side edges of one or more of the conductive members 54 may be exposed in the region 88 so as to be able to electrically couple with circuit layer 86. Preferably, however, the conductive member 54 is substantially encapsulated or surrounded between the polymeric layers 56, 58, except for the exposed first interface portion 60 and second interface portion 62.

The polymeric layers 56, 58 are preferably fused or bonded such that they resemble a contiguous piece. The polymeric layers 56, 58 can also be mated with the use of adhesive, mechanical fusion, melting of the base material or a seed layer, or even deposition techniques used in semiconductor packaging or circuit manufacturing processes. As will be discussed in detail below, the polymeric layers 56, 58 provided controlled or designed mechanical properties that can be modified based upon the required geometries. The conductive member 54 can be printed, etched, laser cut, stamped or molded either prior to lamination or even after to create features or geometries that provide the desired function. In one embodiment, the conductive member 54 is formed directly on one of the polymeric layers 56, 58, such as for example by printing or etching. The opposing polymeric layer is then laminated over the conductive member 54.

The composite contact 52 can be configured to electrically couple with a wide variety of circuit members, including for example a flexible circuit, a ribbon connector, a cable, a printed circuit board, a ball grid array (BGA), a land grid array (LGA), a plastic leaded chip carrier (PLCC), a pin grid array (PGA), a small outline integrated circuit (SOIC), a dual in-line package (DIP), a quad flat package (QFP), a leadless chip carrier (LCC), a chip scale package (CSP), or packaged or unpackaged integrated circuits.

Portions 64 of the polymeric layers 56, 58 form engagement features 66. In the illustrated embodiment, the engagement feature 66 includes a pair of opposing recesses 68 having a shape generally corresponding a shape of solder ball 70 on the first circuit member 72. As the first circuit member 72 is pressed towards the interconnect assembly 50, the engagement feature 66 flex outward in a direction 74 until the solder ball 70 forms an engagement, such as a snap-fit, compressive, and/or interlock with the recesses 68. As used herein, the term "circuit members" refers to, for example, a packaged integrated circuit device, an unpackaged integrated circuit device, a printed circuit board, a flexible circuit, a bare-die device, an organic or inorganic substrate, a rigid circuit, or any other device capable of carrying electrical current.

As used herein, "interlocking" and "interlock" refer to a mechanical coupling where one part is trapped or captured by another part in such a way as to permit at least a portion of one of the parts to move relative to the other part through at least one degree of freedom, such as for example by hooking, snap-fit, non-binding interference fit, dovetailing. An "interlocking feature" refers to a structure for interlocking. As used herein, "snap fit" refers to interlocking by substantially elastic deformation of a composite contact and/or a housing.

Since the solder ball 70 is engaging with plastic portions 64, the insertion force can be relatively small. Additionally, the plastic engagement feature 66 does not form a groove or otherwise damage the solder ball 70 during insertion. The present composite contacts permit an insertion process that places little or no mechanical stress on the relatively thin conductive member 54.

Second interface portion 62 is configured to electrically couple with contact pads 80 on the second circuit member 82, typically by solder. The polymeric layers 56, 58 prevent any solder (see FIG. 2) around the second interface portion 62 from wicking up into housing 84.

In the illustrated embodiment, housing 84 includes a contact coupling layer 86 which engages with coupling feature 88 on the composite contact 52. In the illustrated embodiment, the coupling feature 88 is a narrow region that interlocks or couples with the coupling layer 86. Alternatively, the coupling feature 88 can be a protrusion, an irregular or asymmetrical edge, or a variety of other structures that are adapted to engage with the housing 84.

Alignment layer 90 serves to position the second interface portion 62 in a pre-determined location that corresponds with contact pads 80 on the second circuit member 82. Stabilizing layer 92 limits the deflection of the engagement feature 66 in the direction 74. The layers 86, 90, 92 can be selectively bonded or non-bonded to provide contiguous material or releasable layers. As used herein, "bond" or "bonding" refers to, for example, adhesive bonding, solvent bonding, ultrasonic welding, thermal bonding, or any other techniques suitable for attaching adjacent layers of the housing.

The housing 84 is preferably designed primarily for positioning and mechanical support of the composite contacts 52. The housing 84 can also be used to provide an interference point for retention or inducing flexure. In an alternate embodiment, a monolithic or single layer housing can be used. The layers 86, 90, 92 can be constructed from the same or multiple material types. The layers 86, 90, 92 are optionally selectively laminated to relieve stress caused by thermal expansion differentials.

The housing 84 may be constructed of a dielectric material, such as plastic. Suitable plastics include phenolics, polyesters, and Ryton® available from Phillips Petroleum Company. Alternatively, the housing 84 may be constructed from metal, such as aluminum, with a non-conductive surface, such as an anodized surface. For some applications, the metal housing may provide additional shielding of the composite contacts. In an alternate embodiment, the housing is grounded to the electrical system, thus providing a controlled impedance environment. Some of the composite contacts can be grounded by permitting them to contact an uncoated surface of the metal housing. As used herein, an "electrically insulative connector housing" or a "module housing" refers to a housing that is either non-conductive or substantially coated with a non-conductive material to prevent unwanted conductivity between the composite contacts and the housing, as discussed above.

The discrete layers 86, 90, 92 can be etched or ablated and stacked without the need for expensive mold tooling. The layers 86, 90, 92 can create housing features that have a much larger aspect ratio than typically possible with molding or machining. The layers 86, 90, 92 also permit the creation of internal features, undercuts, or cavities that are difficult or typically not possible to make using conventional molding or machining techniques, referred to herein as a "non-moldable feature." The present housings also permit stiffening layers, such as metal, ceramic, or alternate filled resins, to be added to maintain flatness where a molded or machined part might warp.

The layers 86, 90, 92 of the housing 84 can also optionally include circuitry, such as disclosed in U.S. patent Ser. No. 11/130,494 entitled Compliant Interconnect Assembly, filed May 17, 2005, which is hereby incorporated by reference. Power, grounding and/or decoupling capacitance can be added to or between the layers 86, 90, 92, or between pins, and unique features such as embedded IC devices or RF antennae can optionally be incorporated. In some cases, additional layers can be used to assist with device insertion or removal, such as with ZIF or stripper plate actuation mechanisms. Consequently, the interconnect assembly 50 can be enhanced in ways not possible using conventional molding or machining techniques.

In one embodiment, layer 86 is a circuit layer, such as for example a ground plane or power plane. The circuit layer 86 can optionally electrically couple to conductive member 54 proximate the coupling feature 88. Selectively coupling the composite contacts 52 to the circuit layer 86 permits the interconnect assembly 50 to provide connectivity not readily available with current connector structures.

The interconnect assembly 50 permits the creation of high aspect ratio through holes and slots with internal cavities having non-moldable features, to allow for contact flexure clearance, on fine contact to contact spacing (pitch). The present interconnect assembly 50 accommodates pin counts of 1000-2500 I/O range at 1.0 mm pitch, and more preferably a pitch of about 0.8 millimeter, and most preferably a pitch of about 0.5 millimeter. Such fine pitch interconnect assemblies are especially useful for communications, wireless, and memory devices.

The interconnect assembly 50 provides the ability to press-fit the composite contacts 52 into lower layers to position, point and retain the composite contacts and seal the interface to prevent solder or flux wicking during reflow. A post insertion solder mask (as done on printed circuit boards and IC packages) can also be added to improve solder deposit formation and wick prevention.

The lamination process permits stiffening layers, spacer, circuitry, and/or protective layers to be added to the interconnect assembly 50. The lamination system also permits the creation of high aspect ratio composite contacts, in which almost 80-90% of the physical height of the contacts can be vertically compressed, even in quad contact beam systems. The present low cost, high signal performance interconnect assemblies 50, which have low profiles and can be soldered to the system PC board, are particularly useful for desktop and mobile PC applications.

Use of the present interconnect assembly 50 permits manufactures to install expensive IC devices during system build, providing the opportunity to later customize the system without stocking substitute circuit boards. The use of the present interconnect assembly 50 allows new IC devices to replace initial release IC devices in the field (or at OEM) without the need for disassembling the system or reworking the circuit board. Trends towards lead-free electronics also increases the attractiveness of the present interconnect assembly. The IC supplier can leave the solder balls off their package or device to reduce the lead content.

The interconnect assemblies disclosed herein can optionally be designed to receive multiple circuit members, such as the replaceable chip modules disclosed in U.S. Pat. Nos. 5,913,687; 6,178,629; and 6,247,938, all of which are incorporated by reference.

Figure 2:
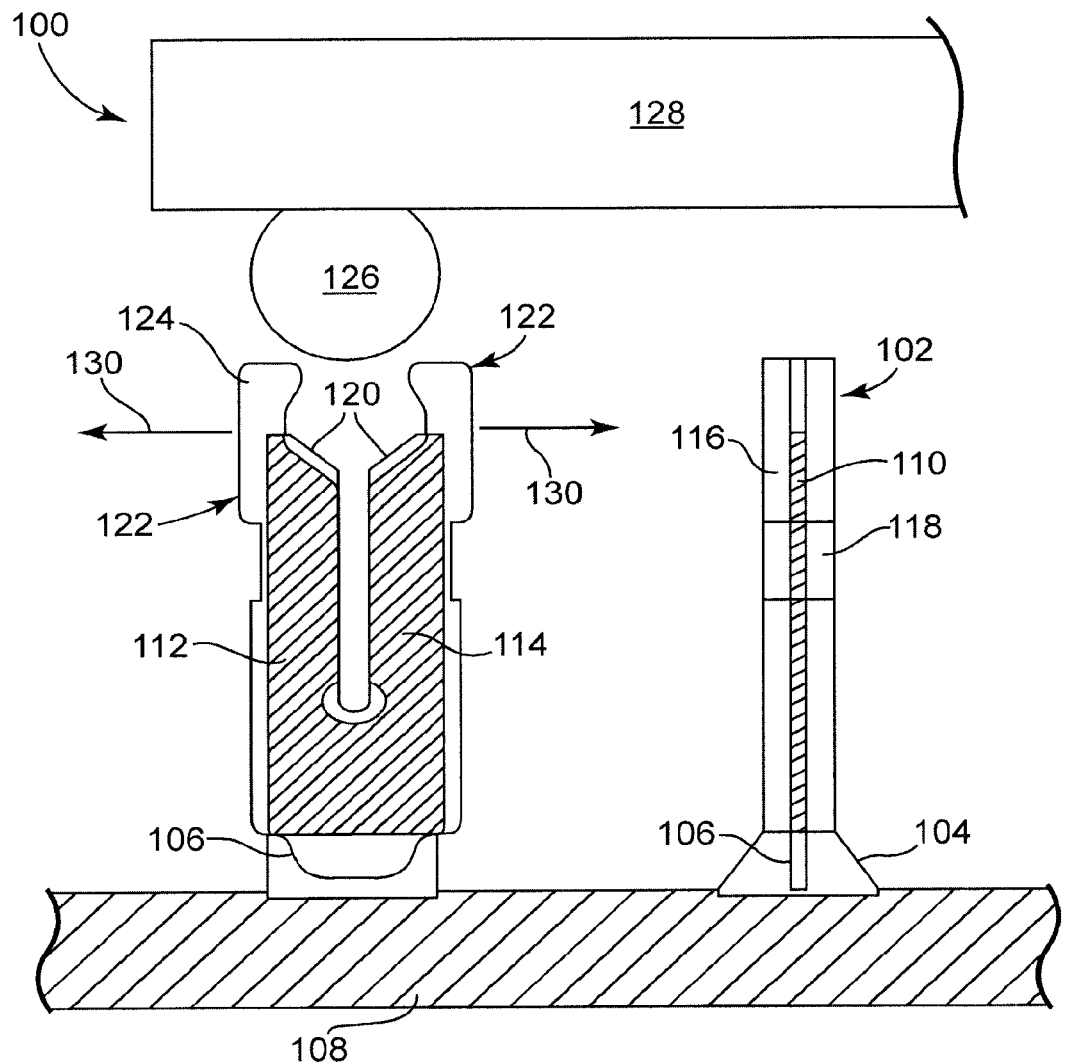
FIG. 2 is a side sectional view of an alternate embodiment of an electrical interconnect assembly with composite contacts in accordance with an embodiment of the present invention.

FIG. 2 illustrates an alternate interconnect assembly 100 in accordance with another embodiment of the present invention with the housing removed for clarity. Any of the housings disclosed herein can be used with the alternate interconnect assembly 100. Composite contacts 102 are shown in both side sectional and front sectional views. Solder 104 bonds the second interface portion 106 to the second circuit member 108. Polymeric layers 116, 118 prevent the solder 104 from wicking along the length of conductive member 110.

In the illustrated embodiment, conductive member 110 includes a pair of beams 112, 114 that project away from the second interface portion 106. First and second polymeric layers 116, 118 preferably substantially encapsulate or surround the conductive member 110 except for the first interface portion 120 and the second interface portion 106.

Portions 122 of the polymeric layers 116, 118 include engagement features 124 that form a snap-fit or interlocking, compressive relationship with solder ball 126 on the first circuit member 128. In the embodiment of FIG. 2, the engagement features flex outward along axis 130 as the solder ball 126 is inserted. The beams 112, 114 may also flex along with the engagement features 124.

Figure 3:
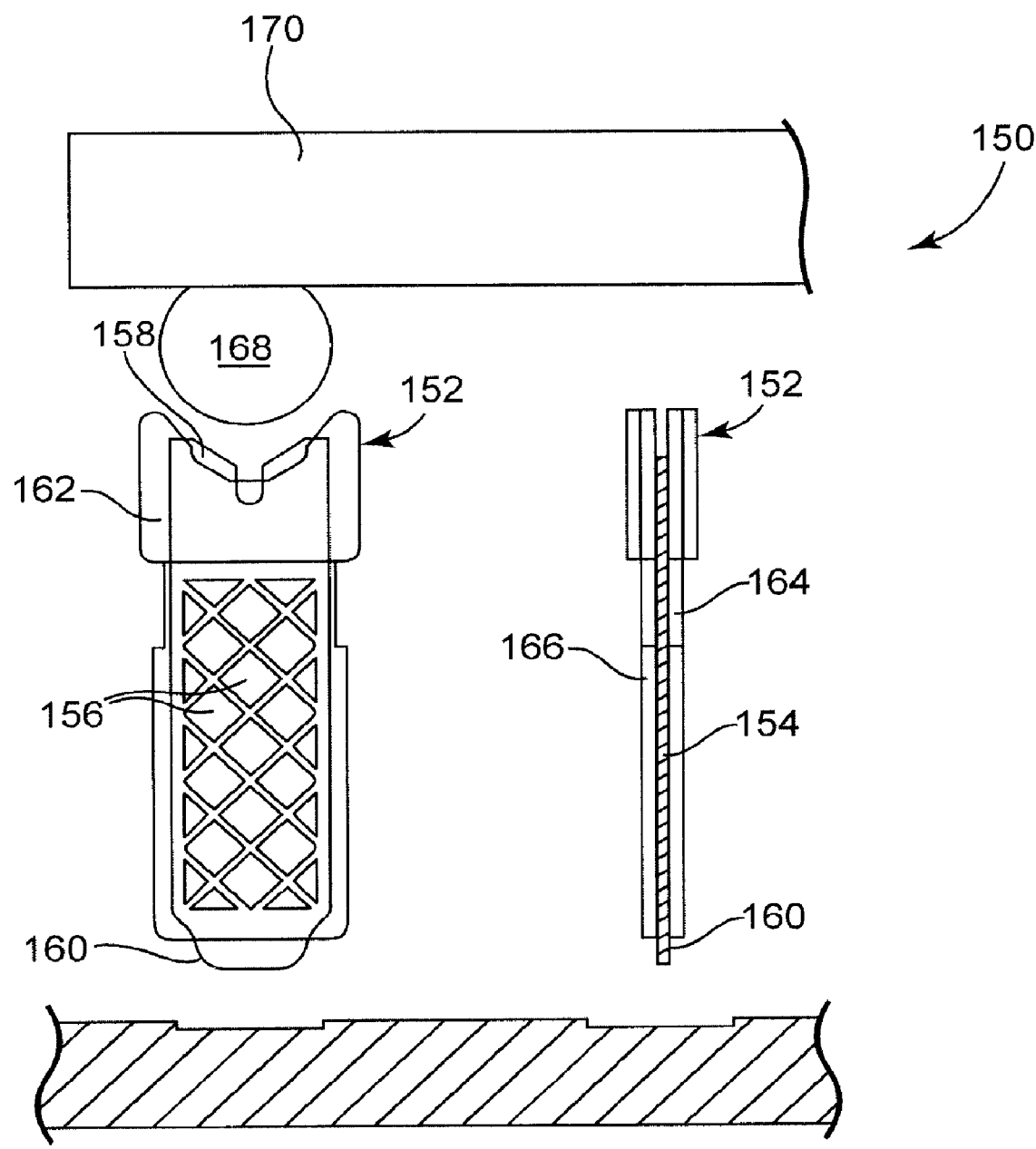
FIG. 3 is a side sectional view of an alternate electrical interconnect assembly with composite contacts in accordance with an embodiment of the present invention.

FIG. 3 is a side sectional view of an alternate interconnect assembly 150 in accordance with an embodiment of the present invention with the housing removed for clarity. Composite contacts 152 are shown in both side sectional and front sectional views. Conductive member 154 is configured with a plurality of openings 156 located between the first interface portion 158 and the second interface portion 160. The openings can be formed by stamping, etching, laser drilling, molding, and a variety of other processes. In the illustrated embodiment, the openings serve to increase the flexibility of the conductive member 154 in the region between the first and second interface portions 158, 160.

In the embodiment of FIG. 3, portions 162 of the polymeric layers 164, 166 serve to engage and align solder ball 168 of the first circuit member 170 with the first interface portions 158. The solder ball 168 can be electrically coupled with the first interface portion 158 by solder, compression, conductive paste, and a variety of other techniques. As used herein, "mechanically couple" and "mechanical coupling" refer to one or more physical structures that serve to position two or more components relative to each other at an interface. Mechanical coupling includes both an interlocking and a non-interlocking engagement.

Figure 4:
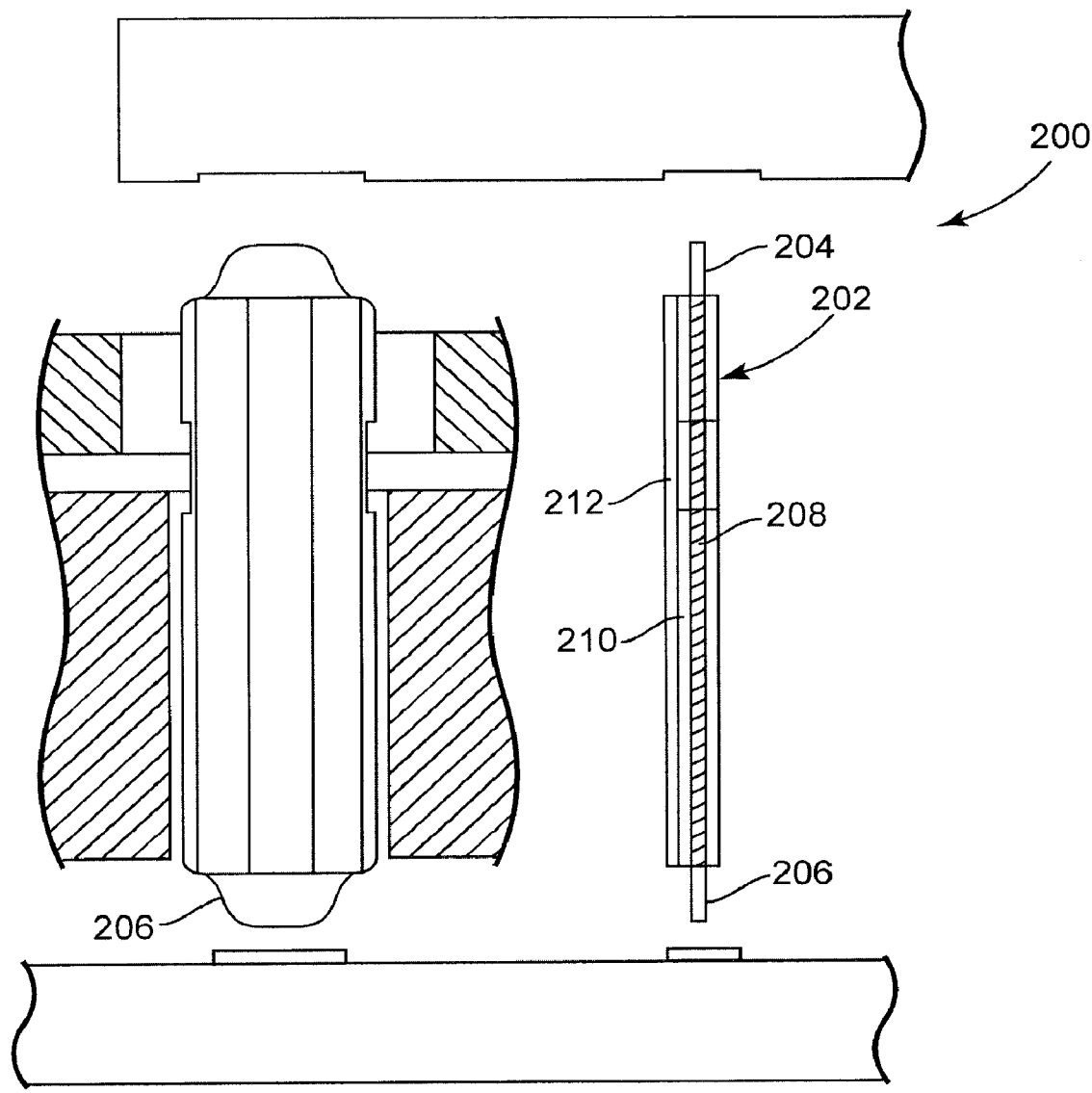
FIG. 4 is a side sectional view of an alternate electrical interconnect assembly with composite contacts in accordance with an embodiment of the present invention.

FIG. 4 is a side sectional view of an alternate interconnect assembly 200 in accordance with an embodiment of the present invention. Front and side sectional views are provided of the composite contact 202. In the illustrated embodiment, first and second interface portions 204, 206 of the conductive member 208 are plated to increase strength. Stiffening layer of plastic 212 is optionally laminated to polymeric layers 210.

The exposed metal tips of first and second interface portions 204, 206 of the conductive member 208 are plated with special materials to reduce the effects of solder contamination, such as for example Rhodium. In another embodiment, the exposed metal tip of the conductive member 208 can be shaped to provide a focused pressure point to repeatedly pierce solder. The nature of the polymeric layers 212 of the present composite contact provides a natural mask which can be used to concentrate plating using every day processes. In another embodiment, different portions of the base metal of the conductive member 208 can be treated differently by exposing different portions at different times during the process, similar to how printed circuit boards are made.

Figure 5:
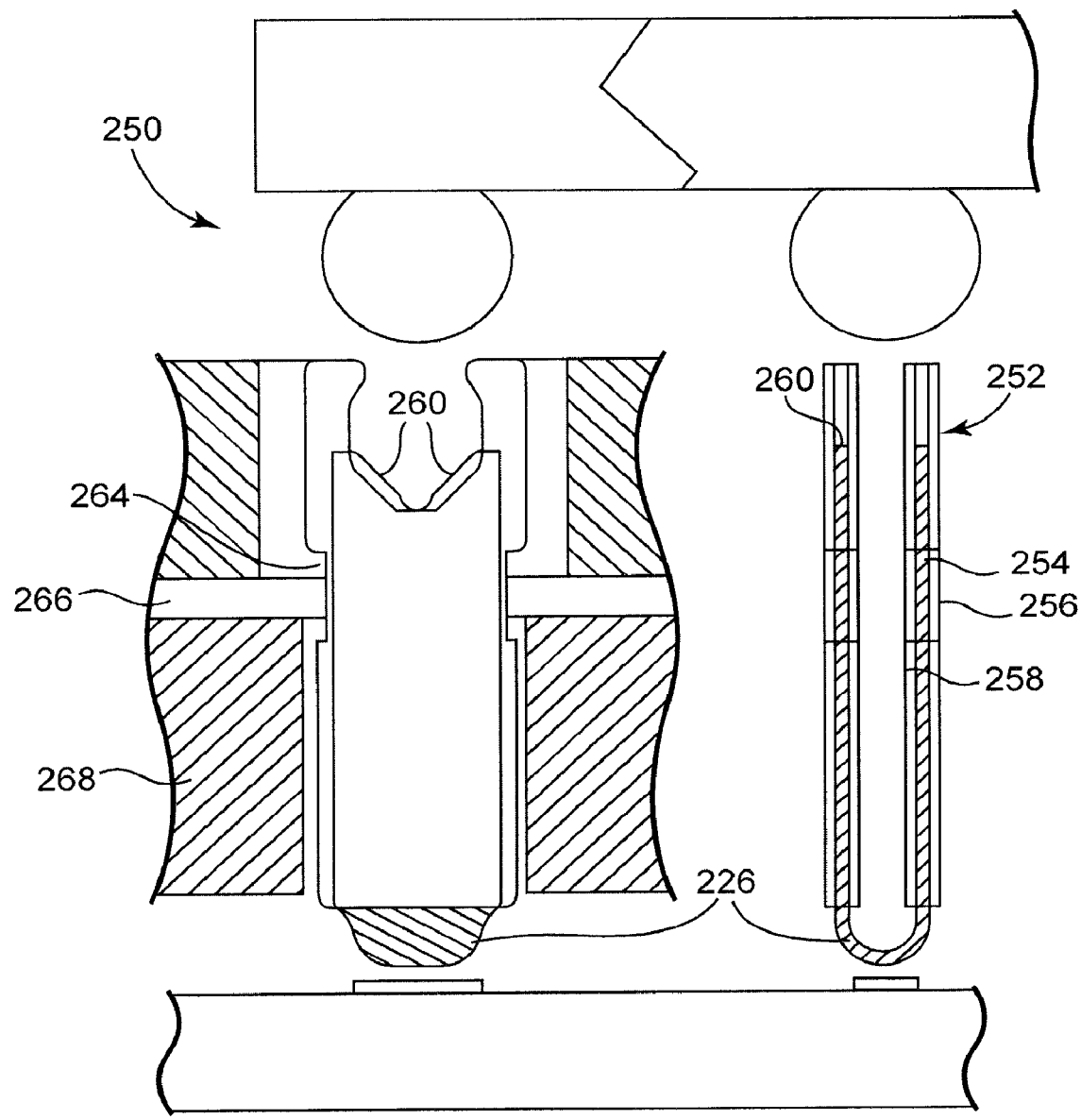
FIG. 5 is a side sectional view of an alternate electrical interconnect assembly with composite contacts in accordance with an embodiment of the present invention.

FIG. 5 is a side sectional view of an alternate interconnect assembly 250 in accordance with an embodiment of the present invention. Composite contacts 252 include an elongated conductive member 254 arranged in a U-shaped configuration. Polymeric layers 256, 258 substantially encapsulate beams 270, 272 of the conductive member 254, leaving first and second interface portions 260, 262 exposed. In the illustrated embodiment, the second interface portion 262 comprises a loop of the conductive material 254. The first interface portion 260 is substantially as shown in FIG. 1.

Recesses or narrow regions 264 in the polymeric layers 256, 258 engage with the contact coupling layer 266 on the housing 268 to retain the beams 270, 272 of the conductive member 254 in the desired orientation and spacing. Once the composite contact 252 is inserted in the housing 268, the second interface portion 262 flexes when pressed against contact pads 280 on the second circuit member 282.

Figure 6:
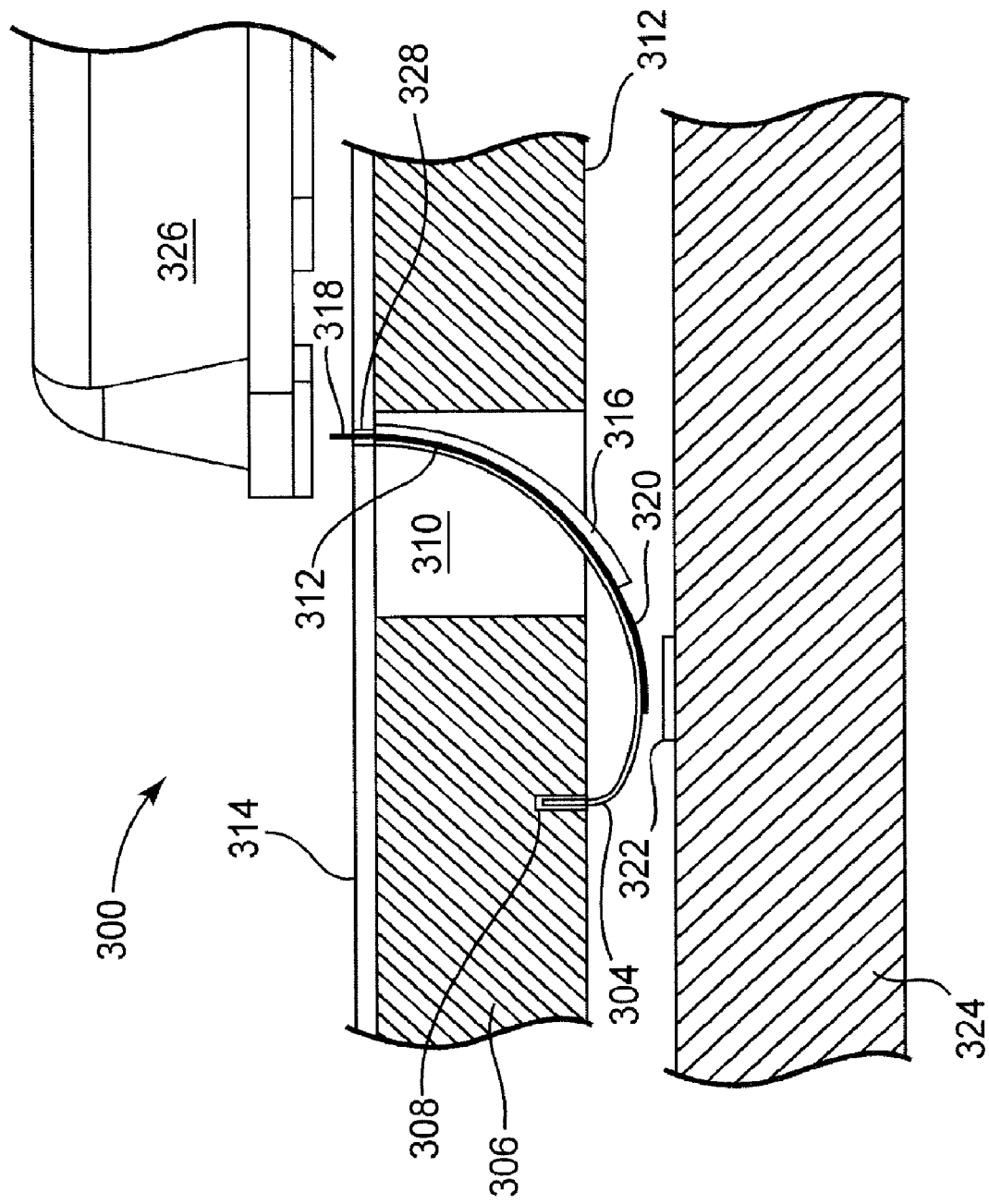
FIG. 6 is a side sectional view of an alternate electrical interconnect assembly with composite contacts in accordance with an embodiment of the present invention.

FIG. 6 is a side sectional view of an alternate interconnect assembly 300 in accordance with an embodiment of the present invention. Composite contact 302 includes polymeric layer 304 coupled to the housing 306 in recess 308. Layer 304 extends through an opening 310 in the housing 306 so that the conductive member 312 forms an arc that extends from lower surface 312 to an upper surface 314 of the housing 306.

Second polymeric layer 316 is preferably provided so that the conductive member 312 is substantially encapsulated except for the first interface portion 318 and the second interface portion 320. It should be noted that the designations of "upper" and "lower" in this context is purely for the convenience of distinguishing different parts of the contact system and the environment in which it is used. These and other directional designations are not intended to restrict the scope of the invention to require the housing to be oriented in any particular direction.

In the illustrated embodiment, the first layer 304 preferably has a certain amount of resiliency so as to act like a spring to press the second interface portion 320 against contact pad 322 on the second circuit member 324. The first interface portion 318 preferably extends above the upper surface 314 to electrically couple with first circuit member 326. In one embodiment, the first interface portion 318 is permitted to slide in hole 328 and the housing 306. The layers 304, 316 preferably provide a biasing force to keep the first interface portion 318 above the upper surface 314, resulting in a compressive interface with the first circuit member 326. Consequently, the first interface portion 318 acts like a spring while engaging with the first circuit member 326.

FIGS. 7A and 7B are front and side sectional views of an alternate composite contact 350 in accordance with an embodiment of the present invention. As best illustrated in FIG. 7A, the conductive member 352 is configured to provide differential flex along the length of the composite contact 350. In the illustrated embodiment, upper portion 354 has greater compliance than lower portion 356. The shape of the conductive member 352 and the encapsulating polymeric layers 358, 360 can be configured to provide varying amounts of flexure and compliance along any portion of the present conductive contact 350.

FIGS. 8A and 8B are front and side sectional views of an alternate composite contact 370 in accordance with an embodiment of the present invention. Conductive member 372 and polymeric layers 374, 376 are configured with a narrow region 378 to provide a central bending axis for the composite contact 370.

FIGS. 9A and 9B illustrate front and side sectional views of an alternate composite contact 400 in accordance with an embodiment of the present invention. Conductive member 402 is configured with a center slot or opening 404 so that beams 406, 408 meet substantially at the first and second interface portions 410, 412, respectively. The opening 404 provides desired electrical properties for some applications.

The present composite contact technology can be used with a variety of other contact structures, such as those disclosed in commonly assigned U.S. patent application Ser. No. 11/253,510 entitled Fine Pitch Electrical Interconnect Assembly, which was filed on Oct. 19, 2005, which is hereby incorporated by reference.

FIGS. 10A and 10B illustrates an alternate composite contact 450 with a complex dual loop conductive members 452 embedded or surround in polymeric material 454. Tips 456, 458 of the conductive member 452 comprise first interface portion. The tips 456, 458 are preferably plated as discussed above. Region 460 comprises the second interface portion.

Portions 462 of the polymeric material 454 comprise tabs 464, 466. The tabs 464, 466 include one or more engagement features 468. As best illustrated in FIG. 10B, the engagement features 468 are adapted to mechanically engage a solder member 470. Solder member 470 electrically couples with portion 460. In the illustrated embodiment, the tabs 464, 466 engage the solder member 470 on two sides in a compressive or interlocking manner. The tabs 464, 466 and engagement features 468 can be configures in a variety of way, such as disclosed in commonly assigned U.S. patent application Ser. No. 11/253,510 entitled Fine Pitch Electrical Interconnect Assembly, which was filed on Oct. 19, 2005, previously incorporated by reference.

Figure 11:
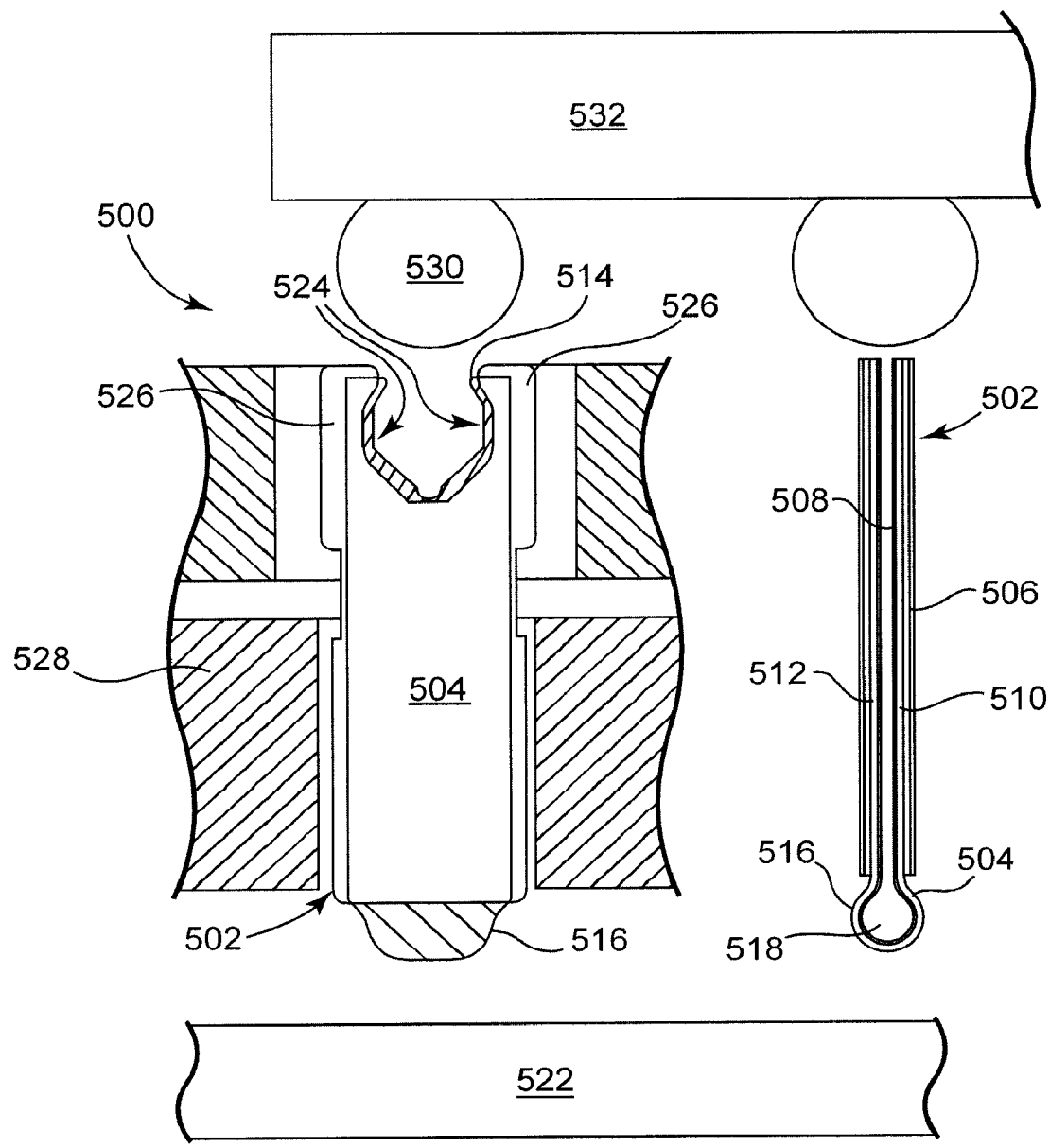
FIG. 11 is a side sectional view of an alternate electrical interconnect assembly with composite contacts in accordance with an embodiment of the present invention.

FIG. 11 is a side sectional view of an alternate interconnect assembly 500 in accordance with an embodiment of the present invention. Composite contacts 502 include an elongated conductive member 504 arranged in a U-shaped configuration. Polymeric layers 506, 508 substantially encapsulate beams 510, 512 of the conductive member 504, leaving first and second interface portions 514, 516 exposed. In the illustrated embodiment, the polymeric layers 506, 508 may each include two or more layers.

In the illustrated embodiment, the second interface portion 516 comprises a loop 518 of the conductive material 504. In the illustrated embodiment, the loop 518 is an eyelet structure extending around more than 180 degrees. Consequently, the loop 518 flexes outward when compressively engaged with second circuit member 522.

The first interface portion 214 is substantially as shown in FIG. 1, except that the conductive material 504 extends substantially around the perimeter of the recesses 524 of the engagement feature 526. Housing 528 preferably retains the beams 510, 512 in a generally parallel configuration to facilitate engagement of the solder members 530 on the first circuit member 532 with the engagement feature 526.

Figure 12:
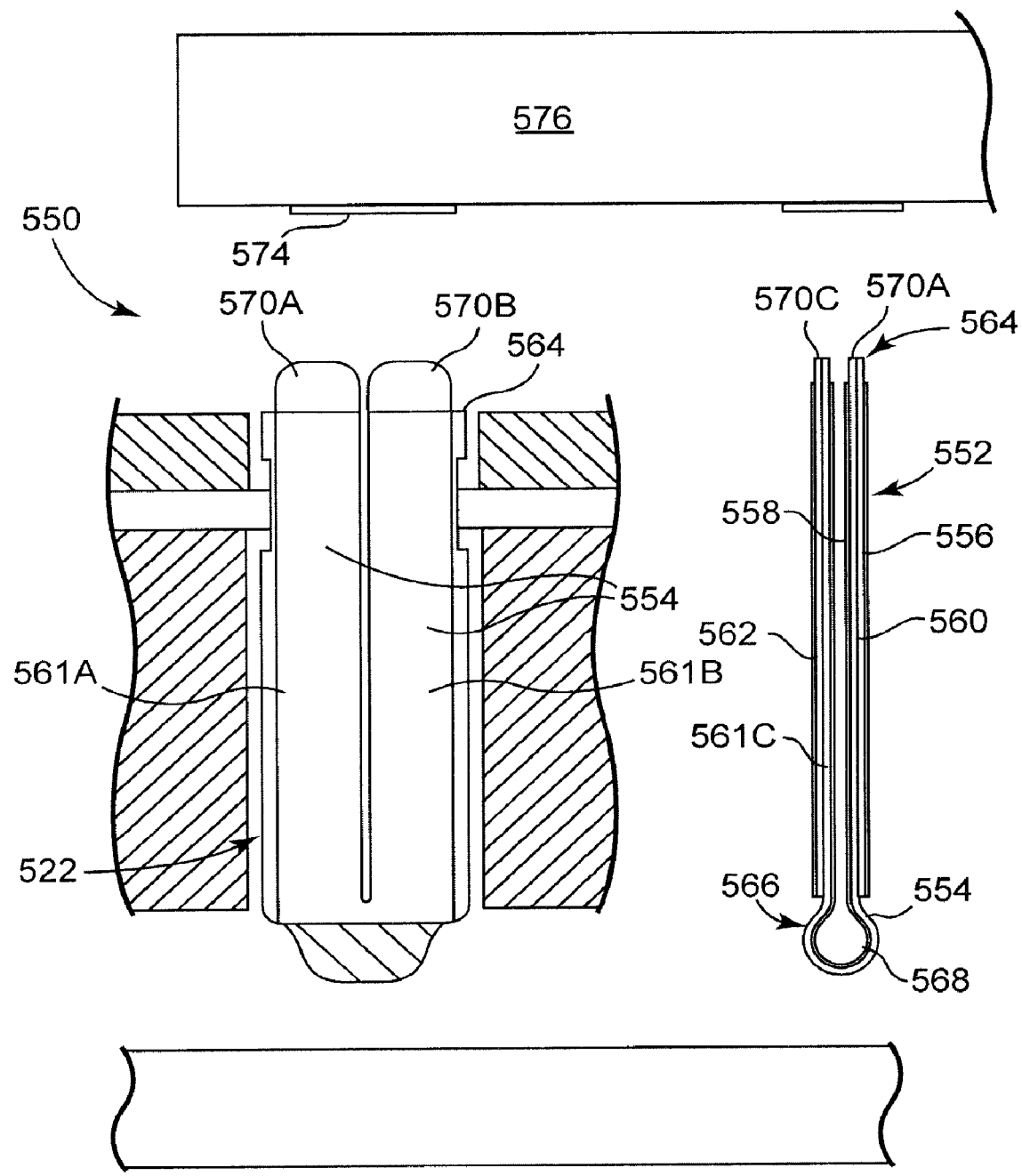
FIG. 12 is a side sectional view of an alternate electrical interconnect assembly with composite contacts in accordance with an embodiment of the present invention.

FIG. 12 is a side sectional view of an alternate interconnect assembly 550 in accordance with an embodiment of the present invention. Composite contacts 552 include an elongated conductive member 554 arranged in a U-shaped configuration. Polymeric layers 556, 558 substantially encapsulate beams 560, 562 of the conductive member 554, leaving first and second interface portions 564, 566 exposed. In the illustrated embodiment, each of the beams 560, 562 are each separated into two additional beams 561A, 561B, 561C (beam 561D not shown).

In the illustrated embodiment, the second interface portion 566 comprises a loop 568 of the conductive material 554. The first interface portion 564 comprises the exposed tips 570A, 570B, 570C (tip 570D not shown) of beams 561. In the illustrated embodiment the tips 570 are arranged in a generally rectangular configuration. Due to the flexible nature of the present composite contact 552, housing 572 can independently position the beams 561 in a variety of configurations so that the tips 570 are arranged to engage with a corresponding contact surface 574 on the first circuit member 576.

Figure 13:
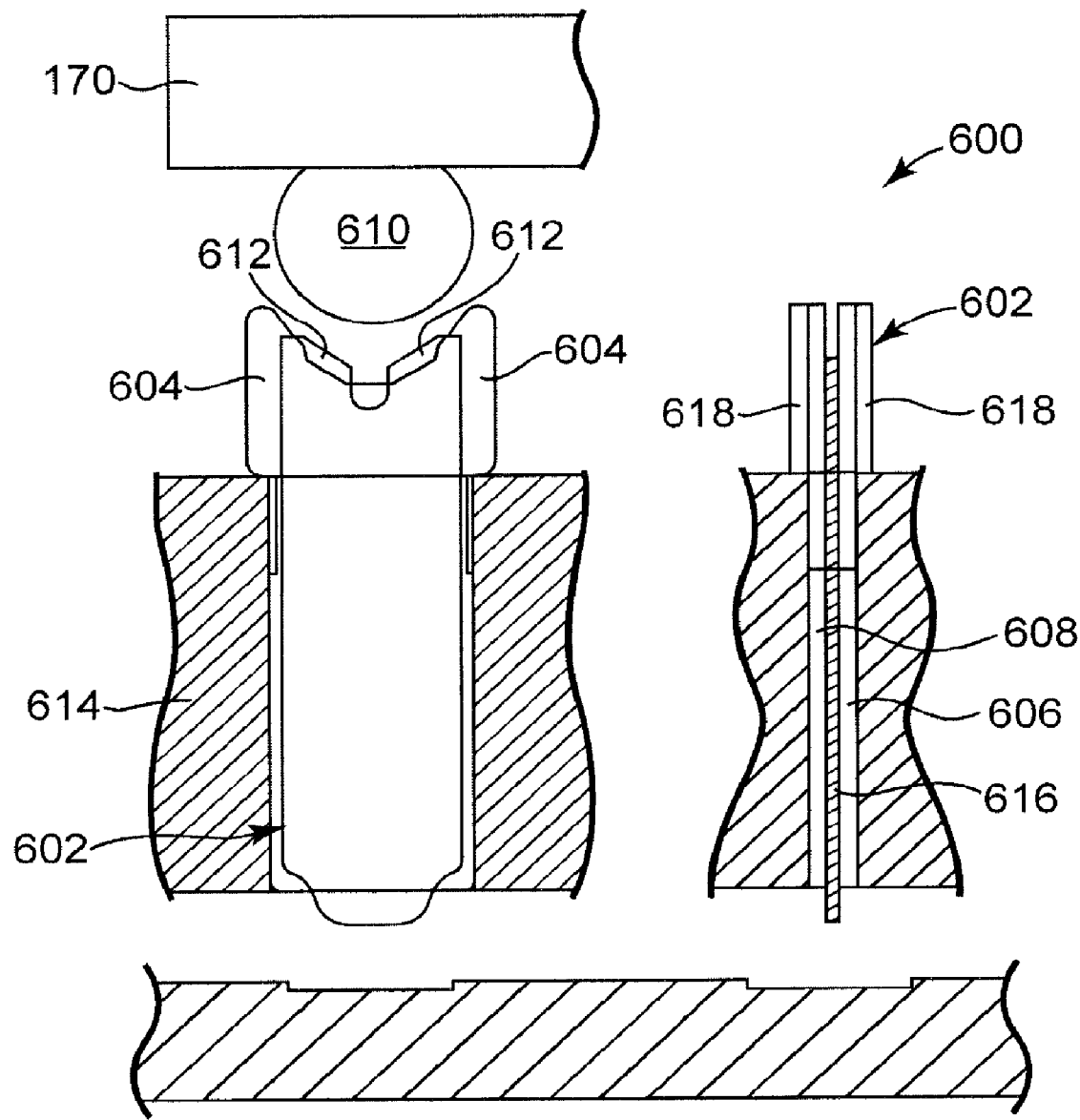
FIG. 13 is a sided sectional view of the electrical interconnect assembly with composite contacts in accordance with an embodiment of the present invention.

FIG. 13 is a side sectional view of an alternate interconnect assembly 600 in accordance with an embodiment of the present invention. Composite contacts 602 are shown in both side sectional and front sectional views. Portions 604 of polymeric layers 606, 608 serve to align solder ball 610 of the first circuit member 170 with the first interface portions 612. The solder ball 610 can be electrically coupled with the first interface portion 612 by solder, compression, conductive paste, and a variety of other techniques.

The composite contacts 602 are located in housing 614 constructed from an elastomeric material. The elastomeric housing 614 provides a restorative force external to the composite contacts 602. Consequently, the composite contacts 602 can be actuated many times without fatigue. Also, the polymeric layer 606, 608 and/or the conductive member 616 can be extremely thin and flexible. In embodiments where the polymeric layers 606, 608 are thin, supplemental reinforcing layers 618 can optionally be added to the composite contact 602 proximate the first interface portion 612. The composite contacts 602 can be inserted into the housing 614 or the housing can optionally be molded around the composite contacts 602.

FIG. 14 is a side sectional view of an alternate interconnect assembly 630 in accordance with an embodiment of the present invention, with the housing removed for clarity. Composite contacts 632 are shown in both side sectional and front sectional views. Portions 634 of polymeric layers 636, 638 serve to align solder ball 640 of the first circuit member 170 with the first interface portions 642.

The composite contacts 632 is supported by spring member 644. The spring member 644 can be metal, polymeric or a variety of other materials. Since the spring member 644 is not part of the conductive path, the signal is not degraded as it passes through the conductive member 646. In the illustrated embodiment, the spring member 644 surrounds the composite contact 632 along a portion of its length. In embodiments where the polymeric layers 636, 638 are thin, supplemental reinforcing layers 648 can optionally be added to the composite contact 632 proximate the first interface portion 642. The spring member 644 can optionally be configured to aid insertion of the composite contacts 632 into a housing, such as for example with a taper. Alternatively, the spring member 644 can have a feature that will orient the composite contact 632 in the housing.

FIGS. 15A and 15B illustrate an alternate composite contact 650 in accordance with an embodiment of the present invention. As best illustrated in FIG. 15A, the conductive member 652 is reduced to the minimum physical size needed to carry the signal. Since the resilience of the polymeric layers 656, 658 provides most of the structural characteristics of the composite contact 650, the conductive member 652 does not require any features other than necessary to carry the signal. The low impedance conductive member 652 is preferred, for example, for cell phone and wireless chip applications. For example, the conductive member 652 permits an impedance of the composite contact 650 to be tuned to 50 Ohms single ended.

Figure 16:
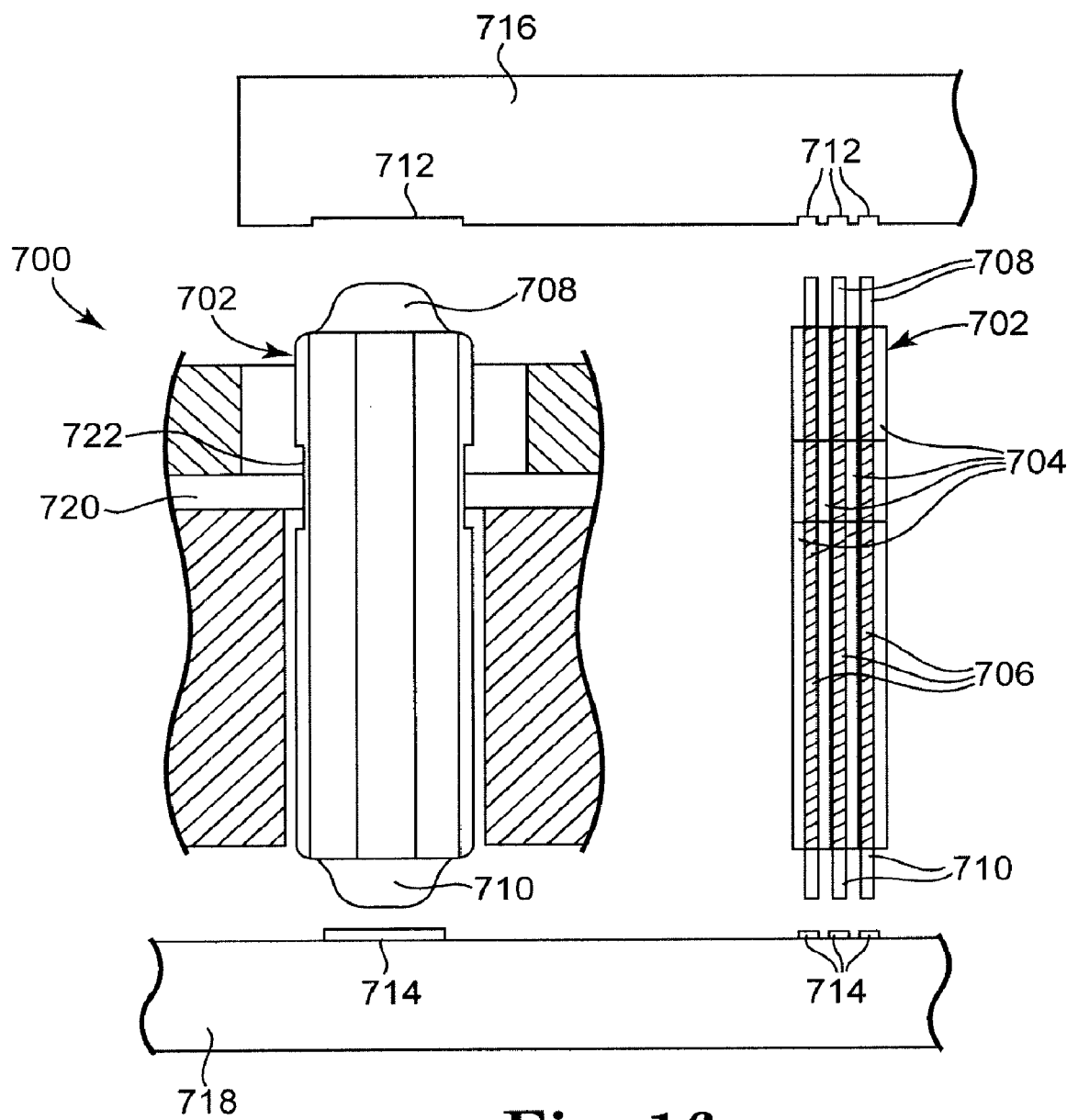
FIG. 16 is a side sectional view of an alternate electrical interconnect assembly with composite contacts in accordance with an embodiment of the present invention.

FIG. 16 is a side sectional view of an alternate interconnect assembly 700 in accordance with an embodiment of the present invention. Composite contacts 702 are shown in both side sectional and front sectional views. In the illustrated embodiment, the composite contacts 702 comprise alternating polymeric layers 704 and conductive members 706. As a result, the pitch of the interconnect assembly 700 is determined by the thickness of the polymeric layers 704 and the thickness of the conductive members 706. As a practical matter, the pitch is limited only by electrical performance requirements of the interconnect assembly 700.

In one embodiment, first and second interface portions 708, 710 of the conductive members 706 are optionally plated to increase strength or to reduce the effects of solder contamination. In another embodiment, the exposed metal tip of the conductive member 706 can be shaped to provide a focused pressure point to repeatedly pierce solder.

In the illustrated embodiment, first interface portions 708 are electrically coupled to recesses 712 on first circuit member 716 and second interface portions 710 are electrically coupled to pads 714 on second circuit member 718. The contact surfaces 712, 714 can be electrically coupled with the interface portions 708, 710 by solder, compression, conductive paste, and a variety of other techniques.

In one embodiment, layer 720 is a circuit layer, such as for example a ground plane or power plane. The circuit layer 720 can optionally electrically couple to the conductive member 706 of one or more of the composite contacts 702 proximate the coupling feature 722. Selectively coupling the composite contacts 702 to the circuit layer 720 permits the interconnect assembly 700 to provide connectivity not readily available with current connector structures.

The particular embodiments disclosed above are illustrative only, as the invention may be modified and practiced in different but equivalent manners apparent to those skilled in the art having the benefit of the teachings herein. For example, the composite contacts and housings disclosed herein can be combined in a variety of ways. Also, any of the solder member attachment mechanism disclosed herein can be combined with any of the connector member beam configurations. Furthermore, no limitations are intended to the details of construction or design herein shown, other than as described in the claims below. It is therefore evident that the particular embodiments disclosed above may be altered or modified and all such variations are considered within the scope and spirit of the invention.

What is claimed is:

1. A method for electrically coupling with terminals on a first circuit member, comprising:
    providing a housing with a plurality of through openings that open on a first surface of the housing;
    providing a plurality of composite contacts each having a conductive member with a central portion, at least one engagement feature, and at least one interface portion, wherein one or more polymeric layers extend along at least the central portion of the conductive member;
    positioning the composite contacts in the plurality of the through openings such that the interface portion is presented at a side of the housing, and the engagement feature retains the composite contacts in the housing;
    mechanically contacting the interface portion of one or more of the composite contacts with a terminal on the first circuit member, while electrically coupling the composite contacts with the terminal on the first circuit member.

2. The method of claim 1, further comprising mechanically engaging the interface portion with the terminal on the first circuit member.

3. The method of claim 2, further comprising configuring the interface portion and the terminal on the first circuit member with interlocking shapes.

4. The method of claim 3, comprising configuring the terminal on the first circuit member as a solder member.

5. The method of claim 4, further comprising reflowing the solder member to fix a connection of the conducting member to the terminal on the first circuit member.

6. The method of claim 4, comprising placing the polymeric layers at a space from the solder member, and reflowing the solder to fix a connection of the conducting member to the terminal on the first circuit member, wherein the polymeric layer prevents the solder from wicking beyond the space.

7. The method of claim 1, wherein said positioning comprising positioning the composite contacts such that said one interface portion and an opposite second interface portion are presented on opposite sides of the housing, and further comprising mechanically contacting the composite contacts with a second circuit member.

8. An electrical interconnect assembly for electrically interconnecting with terminals on a first circuit member, comprising:
    a housing comprising a plurality of openings that open at a first surface;
    composite contacts positioned in a plurality of the openings, each of the composite contacts having a conductive member with a central portion and at least a first interface portion, and at least one polymeric layer extending along at least the central portion of the conductive member;
    at least one coupling feature engaging the composite contact with the housing; and,
    wherein the composite contact has at least one engagement feature presented at the first surface of the housing for engaging with one of the terminals of the first circuit member.

9. The electrical interconnect assembly of claim 8, wherein the at least one engagement member is configured to mechanically couple with said one of the terminals of the first circuit member.

10. The electrical interconnect assembly of claim 9, wherein the polymeric layer is configured to elastically engage with said terminal of the first circuit member.

11. The electrical interconnect assembly of claim 9, wherein the polymeric layer is configured to plastically engage with said terminal of the first circuit member.

12. The electrical interconnect assembly of claim 8, wherein the coupling feature applies at least one of a compressive force, solder, a wedge bond, a conductive adhesive, an ultrasonic bond, a wire bond and an overmolded layer for holding the composite contact in the housing.

13. The electrical interconnect assembly of claim 8, wherein the coupling feature electrically couples the composite contact to a conductive layer in the housing.

14. The electrical interconnect assembly of claim 8, wherein the coupling feature captures the composite contact in the housing with freedom of movement relative to the first circuit member.

15. The electrical interconnect assembly of claim 14, wherein said freedom of movement is limited by mechanical coupling of a portion of the housing in at least one recess in the polymeric layer.

16. The electrical interconnect assembly of claim 9, wherein the engagement feature comprises at least one elastically movable part of the polymeric layer, configured to engage said one of the terminals of the first circuit member against the conductive member.

17. The electrical interconnect assembly of claim 9, wherein the engagement feature comprises wherein the engagement features comprise one of a hole, a recess, a protrusion and a barb mechanically coupleable to the terminal on the first circuit member.

18. The electrical interconnect assembly of claim 16, wherein the engagement feature is configured to couple the composite contact electrically with at least one of a flexible circuit, a ribbon connector, a cable, a printed circuit board, a ball grid array (BGA), a land grid array (LGA), a plastic leaded chip carrier (PLCC), a pin grid array (PGA), a small outline integrated circuit (SOIC), a dual in-line package (DIP), a quad flat package (QFP), a leadless chip carrier (LCC), a chip scale package (CSP), a packaged integrated circuit and an unpackaged integrated circuit.

19. The electrical interconnect assembly of claim 8, further comprising a second engagement feature presented at a second surface of the housing opposite from the first surface, for engaging with one of the terminals of a second circuit member.

20. The electrical interconnect assembly of claim 19, wherein the second engagement feature differs from the at least one engagement features presented at the first surface of the housing.

21. The electrical interconnect assembly of claim 8, wherein at least one of the engagement feature and the coupling feature are provided by opposed tabs at which the polymeric layer extends from the conductive member.

* * * * *